United States Patent [19]

Strickland

[11] 4,204,161

[45] May 20, 1980

[54] APPARATUS FOR RAPIDLY TESTING ELECTROCHEMICAL CELLS

[75] Inventor: John J. Strickland, Alachua, Fla.

[73] Assignee: General Electric Company, Gainesville, Fla.

[21] Appl. No.: 882,354

[22] Filed: Mar. 1, 1978

[51] Int. Cl.² ............................................. G01N 27/42
[52] U.S. Cl. ....................................... 324/426; 320/48
[58] Field of Search ..................... 320/48; 324/29, 29.5

[56] References Cited

U.S. PATENT DOCUMENTS

| 2,833,984 | 5/1958 | Eickhoff | 324/29.5 |
| 3,017,570 | 1/1962 | Floyd | 324/29.5 |
| 3,818,325 | 6/1974 | Boshers | 324/29.5 |

*Primary Examiner*—M. Tokar
*Attorney, Agent, or Firm*—Morgan, Finnegan, Pine, Foley & Lee

[57] ABSTRACT

Apparatus for rapidly testing rechargeable electrochemical cells following assembly which enables the testing of cells to be carried out in a substantially uncharged condition, such apparatus including an automatically actuated probe for applying to and receiving electrical signals at the terminals of the cells as they progress on the assembly line. When extended, a central electrode on the probe engages the central cell terminal and a pair of self-aligning resiliently biased pivotal arms positively engages the rim of the cell casing, which constitutes the other cell electrode, thus establishing reliable electrical contact even in the presence of residue or other manufacturing debris on the cell.

14 Claims, 5 Drawing Figures

APPARATUS FOR RAPIDLY TESTING ELECTROCHEMICAL CELLS

CROSS-REFERENCE TO RELATED APPLICATION

This application discloses and claims subject matter also disclosed in commonly assigned copending application Ser. No. 812,727, filed July 5, 1977, entitled "Method For Rapidly Testing Quality Of Incompletely Charged Electrochemical Cells" and relates to apparatus useful in the method of such application.

BACKGROUND OF THE INVENTION

This invention relates to the testing of electrochemical cells during the manufacturing process and, in particular, to improved apparatus for applying and receiving electrical signals during testing of rechargeable type electrochemical cells.

It is accepted practice in the electrochemical cell manufacturing industry to subject each manufactured cell to a test procedure for the purpose of checking cell performance. In the case of electrochemical cells of the rechargeable type, performance is ascertained by measuring the electrical characteristics of the cell after it has been fully charged. The exact nature of these tests varies from one manufacturer to another but, in general, each involves impressing a full electrical charge (or even overcharge) on the cell and, only then, measuring the cell voltage. Thereafter the cell may be discharged to a predetermined level in order to provide a measure of the length of time for discharge or the magnitude of the discharge current.

In one currently followed procedure, rechargeable nickel-cadmium cells are taken from the assembly line and placed in apparatus which charges the cells at a predetermined rate that is a fraction of the one-hour power current rating ("C") for the cell. This charging is carried out for a time sufficient to effect at least a certain degree of overcharge to the cell. For example, a typical sealed nickel-cadmium cell is charged at the 0.1C rate for 24 hours (C being the current rating of the cell at one hour). This results in the cell's being supplied with a charge equal to 240% of its rated capacity, and the average normal cell may be in overcharge for perhaps 5-7 hours in order to ensure that all cells subjected to the ensuing tests are completely charged.

Prior to terminating the 0.1C charging current applied to the cell, the cell voltage is measured. This voltage measurement generally provides an indication of an insufficient electrolyte, plate mismatch, presence of carbonates or a shorted condition of the cell. A cell voltage while the cell is being charged which is abnormally high indicates a low electrolyte, plate mismatch or presence of carbonates condition, whereas a charge voltage which is abnormally low tends to indicate a short.

After this voltage measurement, the cell is subsequently discharged at the rate of 2C (i.e., at a discharge current which is double the one hour current rating C of the cell), and the time needed for the cell to reach a subnominal voltage is recorded. The discharge time provides an indication of several of the characteristics of the cell, including its capacity, normal or abnormally low electrolyte, leaks, and shorted conditions.

Tests now performed on electrochemical cells, by charging and subsequently discharging the cell, generally provide complete information of the cell behavior and are more than adequate to detect most manufacturing faults or other cell defects; but the procedure has many drawbacks. Space and machinery must be provided in the plant for charging, discharging, and conducting measurements on the cells. Since the cells must be charged for up to 24 hours before any kind of measurement is performed, a great deal of storage space must be provided to accept the full 24-hour plant output of cells so that the cells can be loaded into the charger. It is difficult to conduct such charging on cells moving on a production line due to the large number of cells which are produced over the period of 24 hours (this would require an extremely long track to store and to charge moving cells) and, accordingly, charging is usually done on a batch basis whereby a great number of cells are inserted into the charger at the same time for charging.

The second drawback has to do with the discharging of the cell. Adequate electronic circuitry must be provided in order to sense when the cell voltage of each individual cell has attained the predetermined voltage level (e.g., one volt) and then open the discharge path in order that the cell not be put into an overdischarged condition. Discharge of the cell, being at the 2C rate, consumes another thirty minutes of testing time, following which the last series of electrical measurements are made.

From the foregoing, it can be seen that a great deal of storage space, testing machinery and time are consumed in the mere testing of the cells owing to the fact that each manufactured cell must be charged and discharged. The testing procedure becomes, in essence, a bottleneck.

U.S. application Ser. No. 812,727, filed July 5, 1977, of Rameshchandra V. Shah, entitled "Method For Rapidly Testing Quality of Incompletely Charged Electrochemical Cells" and assigned to the assignee of the present invention, describes a testing method for eliminating the production bottleneck of cell testing while providing a reliable check of the most common defects encountered in the mass production of recharging electrochemical cells. All test measurements are performed in one or two seconds at a station on the actual cell assembly line; for example, at a station immediately after the cell has been sealed.

In that method, a relatively large current pulse of short duration is applied to the terminals of the cell as it is moved along the assembly line. Before terminating the applied current pulse, the voltage across the cell terminals is measured and compared against a predetermined level, or levels, representative of satisfactory cell performance.

Preferably one or more other measurements are made at the same station, such as measurements of the open circuit cell voltage prior to, and immediately after, termination of the current pulse.

Essential to practical quick testing of electrochemical cells on the production line is a reliable test means for applying and receiving electrical signals to and from the cell. In order to avoid the necessity of storing cells during an interim between manufacturing and testing, complete testing of the cell should take place at a rate not slower than the rate of manufacture of the cell. The test means should be capable of operating at the same fast rate. Moreover, the test means must be capable of applying and receiving electrical signals in such a manner that positive electrical contact is established reliably from one cell to the next in the manufacturing environment.

Test procedures used heretofore have employed one type of device or another for applying and receiving electrical signals. Sometimes a plurality of cells is lowered into a common apparatus having a plurality of contacts, one set for each cell, wherein the cell remains in a cell holder for a substantial period of time while the test is being carried out. When attempting to test cells at the production rate, difficulty was experienced in establishing reliable electrical contact under varying maufacturing conditions. Some cells, for example, come off the production line with fine coatings of grease, oil, dust or other particles which interfere with the electrical contact between the cell terminals and the terminals of the measuring apparatus. Attempts to rely on leafspring type contacts for applying and receiving electrical signals to the cell, wherein the cell pushes against and deflects the contact as it moves into the position in which measurement is to be made were unsatisfactory owing to debris and contamination on the cell casings.

The apparatus of the present invention overcomes the foregoing problems and provides means for making electrical contact with the cell terminals on the production line rapidly and reliably. This electrical contact is established notwithstanding mechanical variations in cell size and/or the presence of surface contamination which heretofore has impeded measurement reliability. Moreover, the apparatus of the invention will tolerate small variations in the position of the cell on the assembly line.

SUMMARY OF THE INVENTION

In brief, the invention in its preferred form comprises a probe assembly, actuating means for moving the probe assembly into contact with the cell during testing, the probe assembly carrying a probe disposed to contact the central terminal of the cell during testing, and also carrying a casing terminal-contacting means arranged to be resiliently and yieldably biased into contact with the cell casing when the probe is moved into contact with the central terminal of the cell, the probe and casing terminal contacting means being electrically isolated. Signal conductors connected to the terminal contacting means and the probe, respectively, carry the electrical signals to and from the cell under test.

In a broader sense, the invention comprises a probe assembly, actuating means for moving the probe assembly into contact with the cell during testing and for retracting the assembly upon completion of the test, and positive and negative terminal contacting means, each carried by the probe assembly, for physically and electrically contacting the respective terminals of the cell during testing.

In the preferred embodiment, the casing terminal contacting means comprises a pair of pivotal arms having lower camming surfaces which engage the rim of the casing as the probe is moved toward the cell, whereby these arms may exert sufficient pressure upon the cell casing to effect minor alignment of the cell during testing and ensure that positive electrical contact is made.

The apparatus of the invention preferably is installed closely adjacent the final assembly step for the cells, the cells being indexed one at a time into a test position. The probe actuation is synchronized with the rate of manufacture of cells, testing being carried out on the production line itself.

DESCRIPTION OF THE DRAWINGS

The invention will now be described with reference to the drawings, in which.

DETAILED DESCRIPTION OF THE PREFERRED EMBODIMENT

Figure 1:
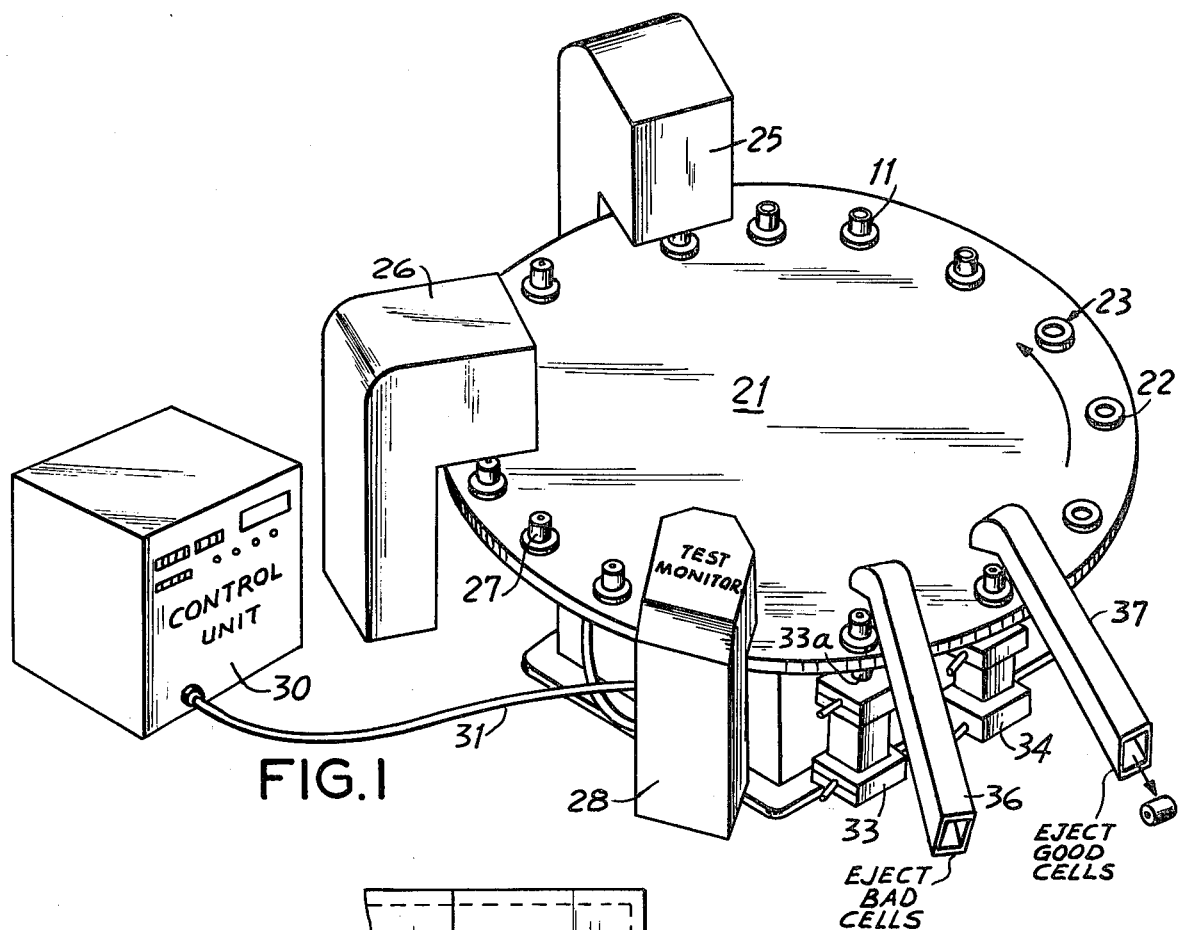
FIG. 1 is a perspective pictorial illustration of the final stages of a representative electrochemical cell assembly line incorporating on-line testing of the assembled cells.

FIG. 1 illustrates the invention in conjunction with machinery used in the last stages of a cell assembly procedure. During manufacture, cell components and cells in various stages of completion are furnished and transported along an assembly line.

Electrochemical cells are transported on a circular table 21, having a diameter of, for example, 3-4 feet. The table is provided with cell holders 22 evenly spaced about the perimeter of the table at angular intervals of about 20°. Thus, there are 18 cell holders 22 on the table 21. Partially completed cells consisting of the metallic cylindrical casing 11 open at the top, and a coiled electrode assembly inside the casing are loaded by hand or by mechanical means into an empty cell holder 22 at the position designated in the drawing by the numeral 23. The table 21 is of the indexing type and rotates, in discrete angular steps of 20°, by a suitable mechanical drive system (not shown). As the partially completed cells proceed in the circular path defined by the motion of the cell holders, various manufacturing operations are performed as, for example, welding the positive electrode closure member onto the postiive electrode conductor tab, positioning the positive electrode closure assembly into the top of the cell casing, crimping the top edge of the battery casing over the outer edges of the closure, and vertically sizing the cell by compressing it in a sizing die. These operations are accomplished at various indexing positions about the perimeter of the table 21 by suitable apparatus, such as the crimping apparatus 25 and sizing apparatus 26.

Cells leaving the sizing station, which is the last step in the manufacturing assembly, are complete and ready for testing. Testing is performed at the test monitor apparatus 28, which generates all testing functions under the control of a control unit 30, electrically connected to the monitor 28 via the electrical cable 31. In practice, the control unit 30 may also include other elements, including air or hydraulic valves to control mechanical elements, such as the cell ejection cylinders 33, 34, associated with the testing function.

From the above, it will be understood that indexing the table transports the cells in discrete steps, each 20°, and that in between transport motions, there is a dwell period during which the various manufacturing operations are carried out. This dwell time is on the order of a few seconds. It is during this dwell time that each cell reaching the position of the test monitor 28 is tested.

The test procedure identifies cells which have met all of the performance tests, described in detail in the previously noted application Ser. No. 812,727, and those cells which do not. If a cell fails any test, an electrical signal is developed which causes the ejection air cylinder 33 to push the rejected cell upward into an ejection chute 36. To this end, a hole is located immediately below each cell holder 22 through which the plunger 33a of the ejection cylinder passes to push the cell upward into the ejection chute. Cells which have not been ejected are indexed to the next succeeding position on the table and are there ejected by actuation of the ejection cylinder 34. The plunger of this cylinder pushes the separate cells into the ejection chute 37.

Figure 2:
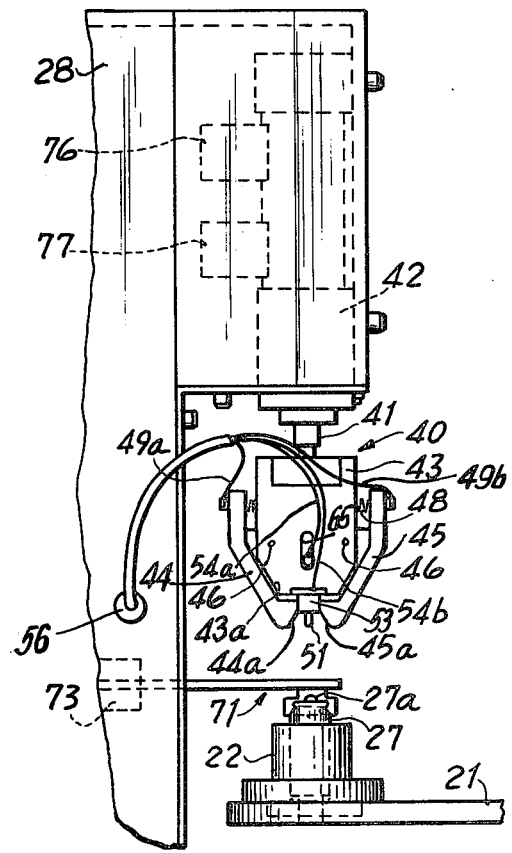
FIG. 2 is a side elevation view of the apparatus in accordance with the invention suitable for use in testing cells.

Reference should now be made to FIG. 2. This drawing illustrates the test monitor 28, which is constructed according to the invention. The function of the test monitor is to make electrical contact with the cell terminals and there apply and receive the electrical signals necessary to ascertain its performance. For example, a current pulse is applied to the cell's terminals and the cell voltage is measured during and after application of the pulse.

Shown in the lower portion of the drawing is a segment of the peripheral edge of the table 21 where it passes the test monitor. When the table is stationary, the cell holder 22 and completed cell 27 are positioned directly under the axis of an axially movable probe assembly 40. This probe assembly is movable downwardly into contact with the cell and subsequently retracted by actuation of an air-powered cylinder 42 located in the upper part of the monitor 28.

Figure 3:
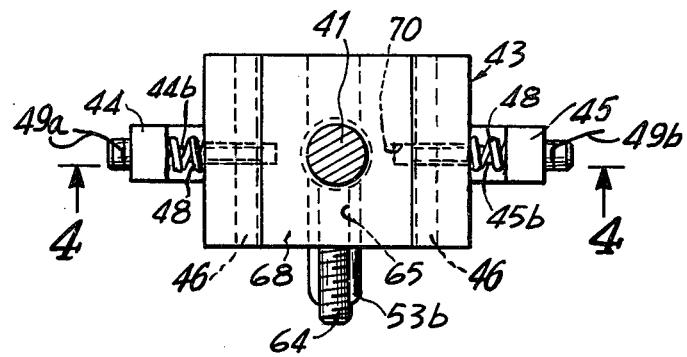
FIG. 3 is a plan view of the probe assembly contained on the FIG. 2 apparatus.
Figure 4:
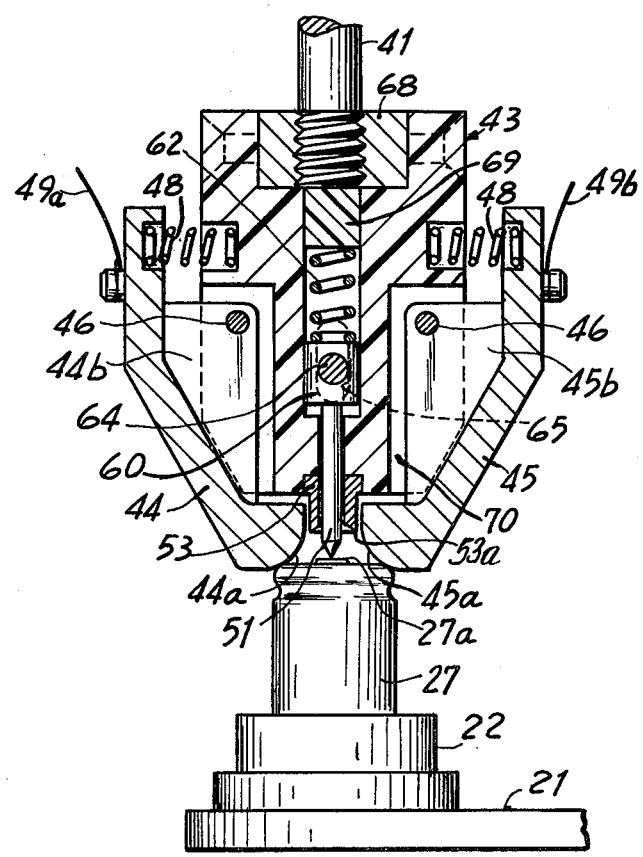
FIG. 4 is an elevational view in cross-section of the probe assembly, taken generally along the line 4—4 in FIG. 3.

The probe assembly 40 is mounted onto the plunger 41 of the air cylinder and includes a head portion 43 which is generally of rectangular cross-section and which has tapered sides 43a at its lowermost portion. Referring to FIGS. 2–4, the head 43 carries a pair of movable contact arms 44, 45. These arms are mounted for limited pivotal movement about the pivots 46 and are resiliently biased into the position shown by springs 48 acting between the upper extremity of the arm and the body of the head portion 43. When the probe 40 is lowered into position by actuation of the air-powered cylinder 42, the arms 44, 45 will engage opposite sides of the upper periphery, or rim, of the cell casing. Each of these arms terminates near the axis of the head in a rounded camming surface 44a, 45a, which is effective to cause the lower extremities of the arms to yield outwardly as the probe head is lowered into contact with the cell.

In most sealed cells, the casing constitutes the negative cell terminal thus electrical contact with the negative cell terminal is made by positive engagement of the arms 44, 45 with the cell casing. Electrical leads 49a, 49b connected to the arms carry electrical signals to and from the cell's negative casing terminal.

Extending from the lower edge of the probe assembly is a probe consisting of a pair of concentric electrical contacts adapted to make physical and electrical contact with the positive terminal 27a at the center of the cell. This pair of electrical contacts includes a resiliently biased retractable pin 51, surrounded by a second contact 53 which is stationary and cylindrical in form, containing a bore for receiving the movable pin 51. The pin 51 and cylindrical contact 53 are connected to separate electrical leads 54a, 54b which apply and receive electrical signals at the central positive terminal of the cell. Leads 54a, 54b, together with leads 49a, 49b are brought out as a unitary cable 55 and enter the monitor cabinet through a plug connector 56. Electrical signals on the conductors of the cable 55 are communicated via the cable 31 to the control unit 30 (FIG. 1) during testing.

Turning to FIGS. 3 and 4, the probe assembly can be seen in more detail. As is illustrated, the head member 43 is of generally block-like rectangular form and is constructed of insulating material such as nylon. The head 43 has a central bore 58 in which the probe member 60 is slidably received, this member terminating in the central probe pin 51. The probe member 60 is resiliently and yieldably biased along the axis of the head, which coincides with the axis of movement, by spring 62. Extending outwardly from the central probe member 60 through the side of the head 43 is a threaded stud 64, this stud being slidably received within a vertically elongate slot 65, the configuration of which is shown by the phantom lines in FIG. 4. The function of the stud 64 is to provide added lateral stability to the probe 51 in the extended position and to provide a terminal to which the electrical lead 54a may be attached.

At the top of the head 43, a rectangular insert 68, which is threaded to receive the air cylinder plunger 41, closes off the central bore 58. Insulating spacer 69 fills a portion of the bore and electrically isolates the metal spring and central probe from the metallic insert 68.

The cylindrical outer probe 53, which also extends from the underside of the head member 43, is formed in a sharp rim. This rim makes physical and electrical contact with a portion of the central terminal 27a of the cell when the probe is in the fully extended position. The member 53 is integrally formed with a bar 53b (FIG. 3) which extends beyond the front face of the head 43 for the purpose of attaching electrical lead 54b (not shown).

Each of the pivotal arms 44, 45 is supported on the head 43 by ribs 44b, 45b which are loosely received in slots 70 and secured by the pivot pins 46. When the probe assembly is in the extended position, the arms 44, 45 are yieldably moved outwardly as springs 48 are compressed by contact of the camming surfaces 44a, 45b with the upper rim of the cell 27. It is by virtue of the inwardly directed pressure provided by springs 48 at the camming surfaces 44a, 45b, that the casing-contacting arms can be made to frictionally engage the cell to ensure good electrical contact. By the same token, since the arms act on opposite sides of the casing, they have a self-aligning effect; that is, they tend to effect minor alignment of the cell so that it is generally coaxial with the central probe 51. The position of the arms when the probe assembly is in the fully extended position is shown generally by the phantom lines in FIG. 4.

During operation, cells on the indexing table 21 are moved seriatim past the test monitor 28 such that, during the table dwell time, the cell to be tested is located underneath the probe assembly and generally in axial alignment therewith. The probe assembly is then extended downwardly by actuation of air cylinder 42 such that the central probes 51, 53 come into firm physical and electrical contact with the central terminal 27a of the cell. The casing terminal contacting arms 44, 45 come into contact with the casing terminal at its perimeter and, since they are resiliently biased inwardly from opposite sides of the probe assembly, are cammed outwardly by the arm surfaces 44a, 45a as the probe assembly moves downwardly.

The test system senses when the indexing table 21 has reached a dwell position (during which time the table is stationary) by closure of switch 74. It also senses whether or not a cell is present in the cell holder 22. To that end, a laterally pivotal sensing arm 71 (FIG. 2) is displaced by movement into position of a cell 27 projecting above the holder 22. Sensing arm 71 is associated with a mechanically actuated switch 73 (FIG. 5) that closes when arm 71 is displaced by a cell movement. Upon the occurrence of these two events [(1) dwell and (2) cell sense], the air cylinder 42 is actuated to extend the probe 40 until such time as the positive probe contacts 51, 53 have made physical contact with the positive terminal 27a of the battery. Once the probe 40 is fully extended, the test sequence may begin. The schematic illustration of FIG. 5 depicts the system for synchronizing probe extension with the cell manufacture rate.

Figure 5:
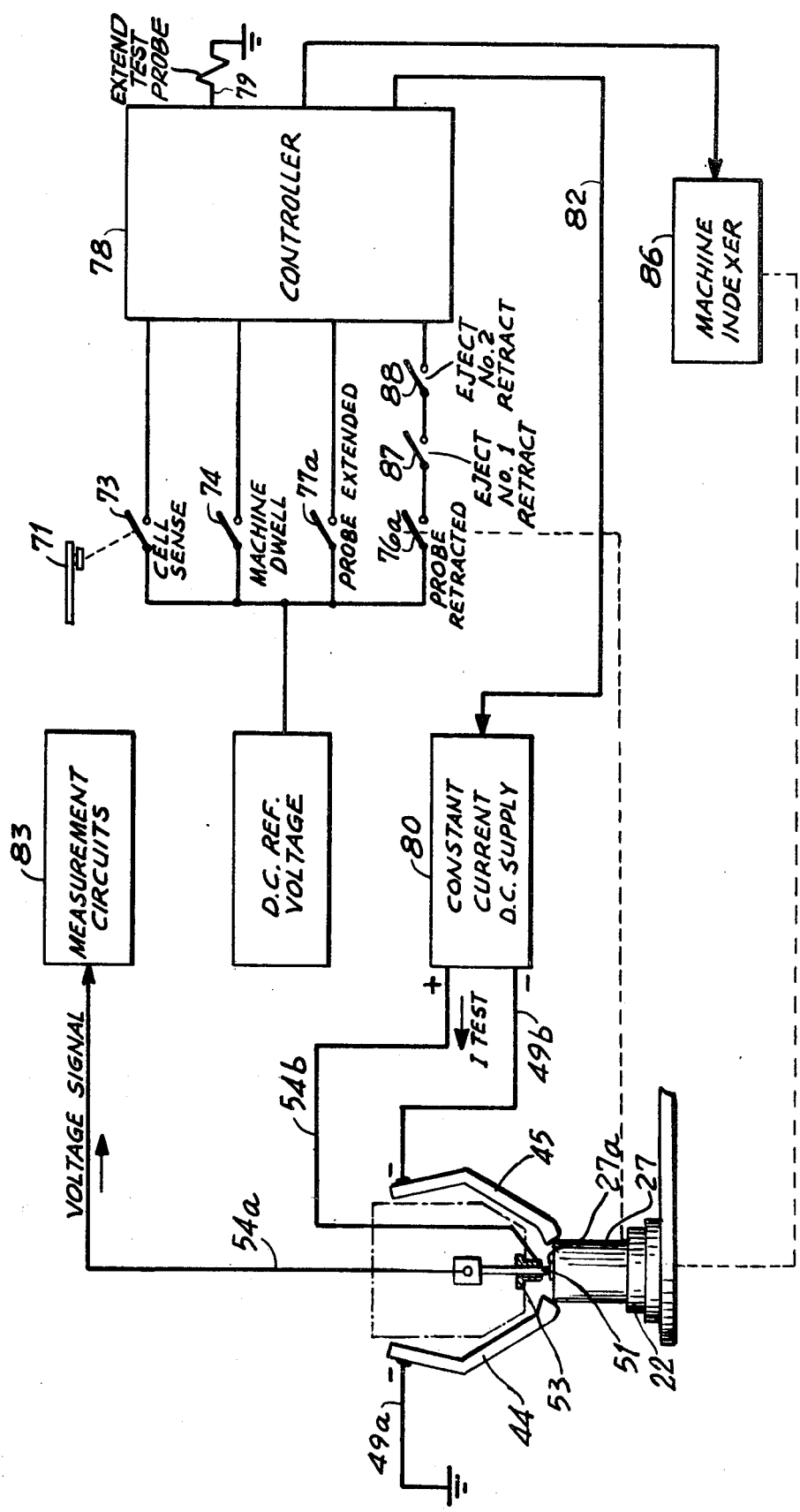
FIG. 5 is an electrical block diagram of a portion of the control system used in conjunction with the invention.

Referring to FIG. 5, mechanically activated switches 73, 74, provide to programmable electronic controller 78 signals representing (1) that table 21 is in its quiescent, or dwell, position and (2) that a cell is present in the cell holder under test monitor 28. The occurrence of these two signals provides a signal on the output line 79 of the controller so as to energize the air valve which controls the probe actuation cylinder 42. The programmable controller 78 constitutes an element of control unit 30 (FIG. 1). It is a solid state logic control system which can be programmed by the user. Basically, it accepts signal inputs and processes them in order to generate desired output signals capable of driving loads such as contactors, solenoids, power supply controls, and other functional elements. Systems of this type are available from commerical sources, such as from Texas Instruments under the designation "5TI Programmable Control System."

The air actuated probe cylinder 42 is equipped with a pair of switches 76, 77 (see FIG. 2) which detect full retraction and extension of the assembly 40. The contact 77a of the switch 77 provides an input signal to the programmable controller 78 when the probe is extended and ready to apply and receive signals to and from the cell under test. Closure of switch 77 inititates the test sequence, and also stops further extension of the probe.

In FIG. 5, the cell under test 27 is shown pictorially, together with the central probe elements 51, 53 and contact arms 44, 45. A constant direct current power supply 80 whose positive output is connected via the lead 54b to the probe contact 53 and whose negative output is connected by lead 49b to arm 45, provides a predetermined constant current to the cell under test whenever its output is switched on. To that end, an output signal from the controller 78 is generated on the conductor 82 at the appropriate time in order to turn on current supplied to the cell. The voltage response of the cell is sensed on leads 54a, 49a connected respectively to probe pin 51 and arm 44. Lead 49a is connected to signal ground while lead 54a feeds the cell voltage signal to measurement circuits 83. These circuits are described in detail in the above noted application Ser. No. 812,727 and are operable to detect whether the cell voltage is within a prescribed range at specific times during the test sequence.

The controller 78 also provides a number of output signals which are used to administer the testing procedure and to provide visual and electrical indications of test results. For example, these output signals energize the ejection cylinders 33, 34 at the appropriate times and drive the electromechanical table indexer 86. Closure of switches contact 76a and switches 86, 88 signals the completion of the test sequence and permits the table 21 to be indexed to the next position.

Though the invention has been described with reference to the preferred embodiment, certain variations can be effected without departing from the spirit and scope of the invention. Thus, changes might be made in the form of resiliently biased terminal contacting elements or in the specific system used to control advancement of the cells, and extension and retraction of the probe assembly. The invention should thus not be considered limited to the details of the preferred embodiment except as defined in the appended claims.

What I claim is:

1. Apparatus for applying and receiving electrical signals at the external terminals of electrochemical cells having a central terminal and a casing terminal, comprising:

a probe assembly;

actuating means for moving the probe assembly into contact with the cell during testing;

a probe carried by the probe assembly and disposed to contact the central terminal of the cell during testing;

casing terminal contacting means carried by the probe assembly so as to be resiliently and yieldably biased into contact with the cell casing when said probe is moved into contact with the central terminal of the cell, said casing terminal contacting means being electrically isolated from said probe; and signal conductors electrically connected to said probe and casing terminal contacting means for applying and receiving electrical signals.

2. Apparatus according to claim 1, wherein said casing terminal-contacting means is biased into contact with the perimeter of the casing during testing.

3. Apparatus according to claim 2, wherein:

the casing terminal contacting means comprises an arm pivotally mounted on said probe assembly so as to be pivotally yieldable upon engaging the cell casing.

4. The apparatus of claim 1, wherein said casing terminal contacting means includes a pair of opposed terminal contacting arms, each said arm being resiliently biased inwardly so as to contact the cell casing perimeter on opposite sides thereof when said probe contact engages the central terminal of the cell.

5. The apparatus of claim 4, wherein each of said terminal contacting arms comprises a camming surface for engaging the cell casing, said surface being configured to urge said arm outwardly when engaged by the cell casing during axial movement of the probe assembly toward the cell.

6. Apparatus according to claim 1, wherein said probe is resiliently biased in the direction of movement of said probe assembly and is retractably mounted in said probe assembly.

7. Apparatus for applying and receiving electrical signals at the external terminals of electrochemical cells for test purposes, the cells having a cylindrical casing constituting one cell terminal and having a central terminal at an end thereof, the apparatus comprising:

a probe assembly;

actuating means for extending said probe assembly into contact with the cell during testing thereof and for retracting said probe assembly upon completion of the test;

first terminal contacting means carried by said probe assembly for physically and electrically contacting the central terminal of the cell in the extended position of the probe assembly;

second terminal contacting means carried by said probe assembly for physically and electrically contacting the cell casing in the extended position of the probe assembly, said first and second terminal contacting means being yieldable relative to one another; and signal conductor means connected to said terminal contacting means for applying to and receiving from the cell electrical signals during testing.

8. Apparatus according to claim 7, further comprising:

means synchronized with the extension and retraction of said actuating means for moving a plurality of cells seriatim into a test position in alignment with the axis of motion of said probe assembly.

9. Apparatus according to claim 7, wherein said second terminal contacting means is resiliently biased toward and yieldably movable upon contact with the cell casing.

10. Apparatus according to claim 9, wherein said second contacting means is yieldably movable in a direction transverse to the direction of movement of the probe assembly.

11. Apparatus according to claim 8, wherein said first terminal contacting means comprises a pair of contact members, the apparatus further comprising:

means including said signal conductor means for connecting one of said contact members to a source of current to be applied during testing of the cell and for connecting the other said contact member to measurement means for detecting the cell voltage.

12. Apparatus according to claim 11, wherein said contact members extend in the direction of movement of said probe assembly.

13. Apparatus according to claim 12, wherein said central terminal contact members are concentric.

14. Apparatus according to claim 13, wherein one of said concentric contact members is resiliently biased in the direction of its extension and is yieldably retractable upon contact with the central cell terminal.

* * * * *